(12) United States Patent
Park et al.

(10) Patent No.: US 7,012,945 B2
(45) Date of Patent: Mar. 14, 2006

(54) MULTI DFB LASER DIODE

(75) Inventors: Kyung-Hyun Park, Daejeon (KR); Young-Ahn Leem, Daejeon (KR); Dong-Churl Kim, Daejeon (KR); Dae-Su Yee, Daejeon (KR); Sung-Bock Kim, Anyang (KR); Yong-Soon Baek, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 265 days.

(21) Appl. No.: 10/725,822

(22) Filed: Dec. 1, 2003

(65) Prior Publication Data

US 2004/0125845 A1     Jul. 1, 2004

(30) Foreign Application Priority Data

Dec. 13, 2002   (KR) ...................... 10-2002-0079599

(51) Int. Cl.
  *H01S 5/00*       (2006.01)
(52) U.S. Cl. ............................. 372/50; 372/43; 372/44
(58) Field of Classification Search ................ 372/50, 372/43
  See application file for complete search history.

(56) References Cited

U.S. PATENT DOCUMENTS

| | | | |
|---|---|---|---|
| 6,122,306 A | | 9/2000 | Sartorius et al. |
| 6,690,688 B1 * | | 2/2004 | Gotoda ........................ 372/20 |
| 6,728,279 B1 * | | 4/2004 | Sarlet et al. ............. 372/43.01 |

FOREIGN PATENT DOCUMENTS

| | | |
|---|---|---|
| KR | 1002384220000 | 10/1999 |
| KR | 1002890400000 | 2/2001 |
| KR | 1020010099042 | 11/2001 |

OTHER PUBLICATIONS

Y.A. Leem, et al.; "Study on Optimized . . . Laser Diode"; WDM Photonic Devices Team and Optoelectronic Materials Team, ETRI (two pages).

G.C. Joo, et al.; "Bidirectional Optical Coupling of Transceiver CHJIP for Subscribers"; Electronics Letters, Nov. 26, 1998, vol. 34, No. 24 (pp 2350-2351).

F.Mallecot, et al.; "-31 dBm Sensitivity of a Monolithic . . . Temperature Range"; F.Doukhan, ThN2-1/191-194.

Martin Mohrle, et al.; "Detuned Grating Multisection-RW-DFB Lasers . . . Processing"; IEEE Journal on Selected Topics in Quantum Electronics, vol. 7, No. 2, Mar./Apr. 2001 (pp. 217-223).

* cited by examiner

*Primary Examiner*—Minsun Oh Harvey
*Assistant Examiner*—Dung (Michael) T. Nguyen
(74) *Attorney, Agent, or Firm*—Blakely Sokoloff Taylor & Zafman

(57) ABSTRACT

A multi DFB laser diode for generating spontaneous pulses comprises first and second DFB sections each of which has a substrate including a diffraction grating, an active layer formed on the substrate, a clad layer formed on the active layer and including a refraction varying layer, and an electrode formed on the active layer; and a phase tuning section including a substrate, an active layer formed on the substrate, a clad layer formed on the active layer, and an electrode isolated from the electrode of the first and second DFB sections. The refraction varying layer in the active layer of the first DFB section has a refractive index different from that of the refraction varying layer in the active layer of the second DFB section.

9 Claims, 3 Drawing Sheets

MULTI DFB LASER DIODE

CROSS REFERENCE TO RELATED APPLICATION

This application claims priority to and the benefit of Korea Patent Application No. 2002-79599 filed on Dec. 13, 2002 in the Korean Intellectual Property Office, the content of which is incorporated herein by reference.

BACKGROUND OF THE INVENTION (a) Field of the Invention

The present invention relates to a multi DFB (distributed feedback) laser diode. More specifically, the present invention relates to a multi DFB laser diode improved to have a smooth self-pulsing operation.

(b) Description of the Related Art

In an optical communication system, clock recovery for 3R regeneration (re-timing, re-shaping, and re-amplifying) is carried out through an optical pulse device. Conventionally, an optical pulse is generated using Q-switching or phase locking that oscillates beams of more than two modes whose relative phases are locked, and makes them interfere with each other. Q-switching is not suitable for high-speed optical communications because its speed is limited by modulation bandwidth, but phase locking can be utilized without having restriction on the speed since a pulse repetition rate is determined by the interval between modes. In particular, a mode-locked laser diode and a multi DFB laser diode employing phase locking are widely used for optical communication systems.

In case of the mode-locked diode, injection locking is difficult to perform at a bit rate of more than 40 GHz, and its power is very low at several mW. Accordingly, studies on the multi DFB laser diode are being undertaken, but it also has problems. First of all, when the period of a diffraction grating is not in accord with two DFB sections accurately, a light intensity difference become asymmetrical so that the modulation index of the pulse generated is deteriorated. To solve this problem, the period of the diffraction grating is controlled through e-beam lithography. However, this method is costly and not suitable for mass production. Furthermore, generation of a single mode, which is a fundamental problem of the DFB laser diode, is problematical in terms of production yield.

SUMMARY OF THE INVENTION

It is an advantage of the present invention to provide a multi DFB laser diode to which a method of easily and accurately controlling a relative position of modes of two DFB sections is applied to solve the problem of the prior art. This method produces a symmetrical structure to remarkably improve the modulation index.

To accomplish the object of the present invention, there is provided a multi DFB laser diode for generating a spontaneous pulse, comprising first and second DFB sections each of which has a substrate including a diffraction grating, an active layer formed on the substrate, a clad layer that is formed on the active layer and includes a refraction varying layer, and an electrode formed on the active layer; and a phase tuning section that includes a substrate, an active layer formed on the substrate, a clad layer formed on the active layer, and an electrode, the electrode being isolated from the electrode of the first and second DFB sections.

In one aspect of the present invention, the refraction varying layer included in the active layer of the first DFB section has a refractive index different from that of the refraction varying layer included in the active layer of the second DFB section.

In one aspect of the present invention, the first and second DFB sections and the phase tuning section are formed on one substrate, and the electrodes of the first and second DFB sections and the phase tuning section are isolated from each other by an etched groove.

In one aspect of the present invention, the outer sides of the first and second DFB sections are shielded by an anti-reflecting thin film.

In one aspect of the present invention, the substrate is formed of n-InP, the active layer is formed of InGaAsP, and the clad layer is formed of p-InP.

In one aspect of the present invention, p-InP and n-InP are sequentially deposited on both sides of the active layer in a manner such that the p-InP and n-InP etch both sides of the diffraction grating included in the substrate, to form a p-n-p blocking structure between the clad layer formed on the n-InP layer and the substrate.

In one aspect of the present invention, a SiNx layer is formed between the first and second DFB sections and the clad layer.

To accomplish the object of the present invention, there is also provided a method for fabricating a multi DFB laser diode for generating a spontaneous pulse, the method comprising the steps of forming a substrate; forming a diffraction grating in the substrate; forming an active layer on the substrate; forming refraction varying layers in the active layer; forming an electrode on the active layer; and forming two etched grooves to divide the electrode into three parts which are isolated from one another, wherein the diffraction grating and the refraction varying layer are formed in the regions corresponding to two parts among the three divided electrode parts, which are respectively located at both sides.

In one aspect of the present invention, the refraction varying layers respectively formed at the regions corresponding to the electrode parts located at both sides have refractive indexes different from each other.

According to the aforementioned structure, the present invention produces two symmetrical mode oscillations of a multi DFB laser diode generating a spontaneous pulse to remarkably improve the modulation index and process yield.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
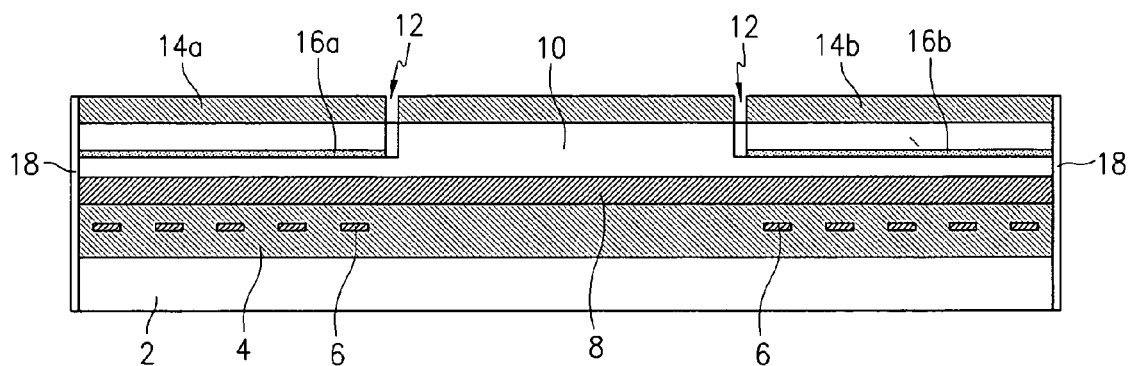
FIG. 1 is a cross-sectional view of a laser diode according to the present invention.

FIG. 1 is a cross-sectional view of a planar buried heterostructure (PBH) type multi DFB laser diode according to the present invention, used for a high-speed optical signal processor, which is obtained by cutting the laser diode in the direction of a resonator.

Referring to FIG. 1, an n-InP layer 4 is formed on an n-InP substrate 2, and a diffraction grating 6 is formed in the n-InP layer 4. An undoped InGaAsP active layer 8 is placed on the n-InP layer 4. In addition, a p-InP layer 10 is formed on the undoped InGaAsP active layer 8 as a clad layer. An electrode layer is formed on the p-InP clad layer 10 and divided into two parts 14a and 14b by an etched groove 12. Portions of the p-InP layer 10 which correspond to the two parts 14a and 14b of the electrode layer serve as refraction varying layers 16a and 16b. These refraction varying layers 16a and 16b have refractive indexes different to each other.

The aforementioned stacked structure is formed through general well-known processes including deposition, etching, doping, diffusion, and so on. Both sides of the structure are shielded by an anti-reflecting thin film 18.

In the preferred embodiment, a multi DFB laser diode has three sections divided by the etched groove 12. In detail, the multi DFB laser diode includes DFB sections including two refraction varying layers 16a and 16b, and a phase tuning section provided therebetween.

In this instance, a difference of Bragg wavelengths can be controlled by differently setting the refraction indexes of the refraction varying layers 16a and 16b in the two DFB sections. Also, the process can be more simplified by using the actually same active layer 8 of the phase tuning section provided between the DFB sections as the layer of the DFB section, and the repetition rate can be controlled by modifying the correlations of the two DFB sections without violating the symmetry of the two DFB sections.

Figure 2:
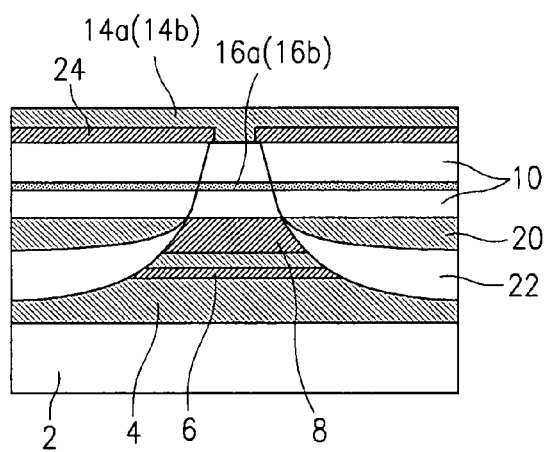
FIG. 2 is a side cross-sectional view of FIG. 1.

FIG. 2 is a cross-sectional view of the DFB laser diode according to the present invention, which is obtained when the cross-sectional structure of FIG. 1 is cut in the direction of a resonator.

Referring to FIG. 2, a p-InP 22 and an n-InP 20 are sequentially deposited on both sides of the undoped InGaAsP active layer 8 in such a manner that both sides of the diffraction grating 6 included in the in-InP layer 4 are etched, to form a p-n-p blocking structure between the p-InP layer 10 and the n-InP layer 4. The electrode 14a and 14b is partially isolated from the surface of the p-InP layer 10 by a SiNx layer 24 formed between them and selectively comes into contact with the p-InP layer 10 through a via hole. The SiNx layer 24 transfers current applied to the electrode 14a and 14b to the active layer of the p-n-p blocking structure.

In the meantime, the thickness, width, and composition of the diffraction grating included in the n-InP layer 4 become factors that determine a coupling coefficient indicating interaction of a forward traveling wave and a backward traveling wave.

Figure 3:
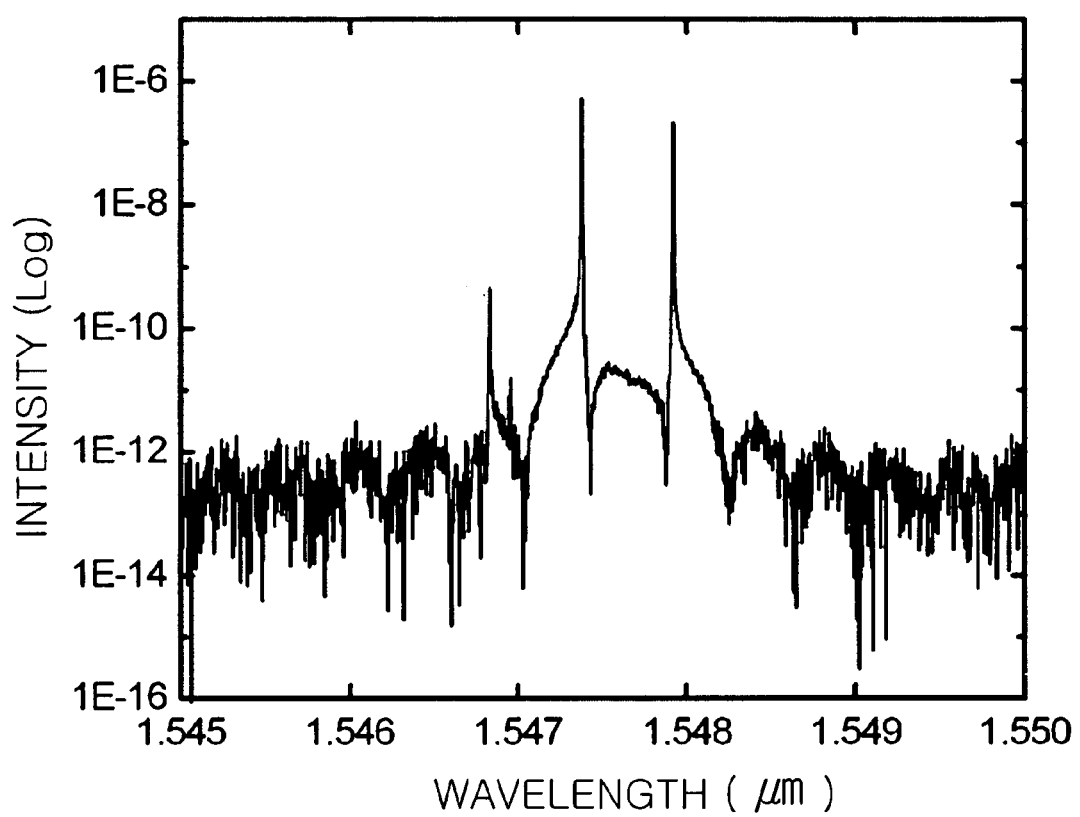
FIG. 3 shows an optical spectrum obtained through measurement of power of the laser diode of the present invention in a time-domain model.
Figure 4:
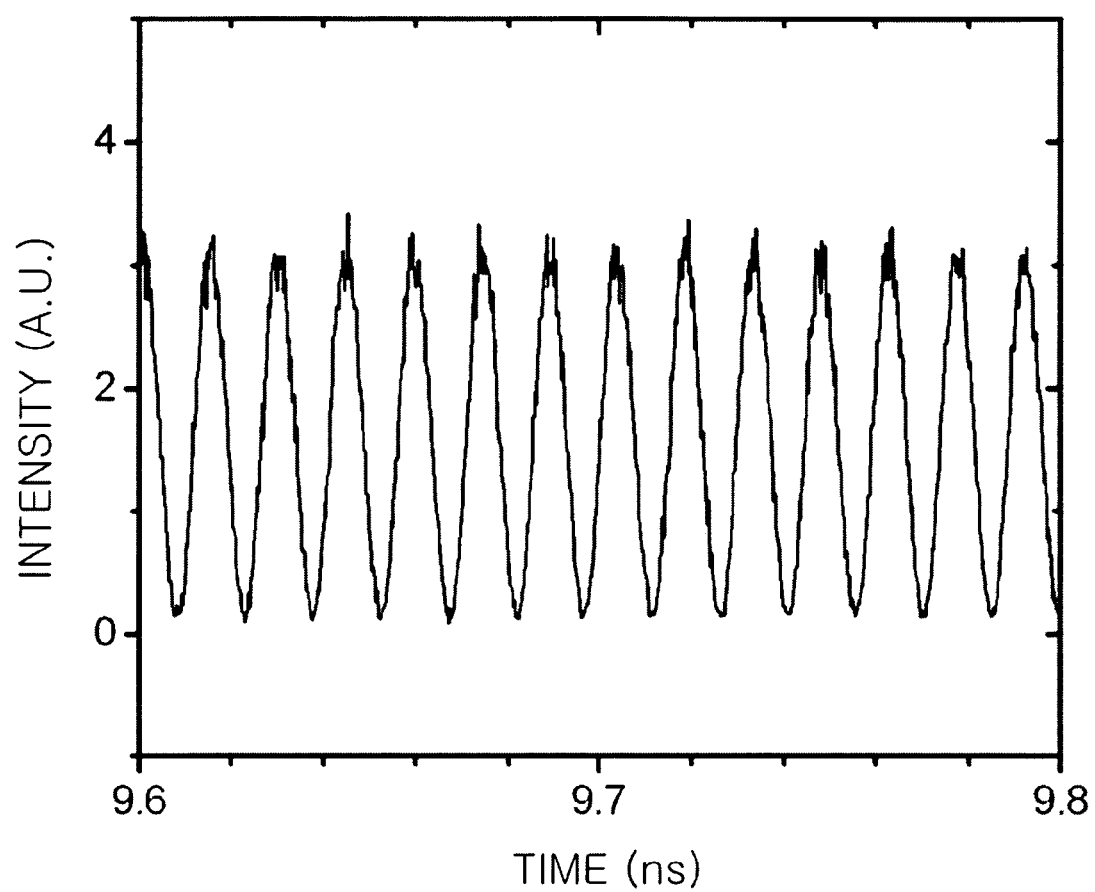
FIG. 4 shows output power of the laser diode of the present invention, which is obtained through time-domain measurement.

FIGS. 3 and 4 show output intensities of the above-described DFB laser diode of the present invention, which are obtained through measurements according to a time-domain model.

FIG. 3 illustrates the relationship between optical intensity and wavelength. From FIG. 3, it can be known that two beams whose phases are locked interfere with each other to generate pulses at wavelengths between 1.547 GHz and 1.548 GHz. This results from the refraction varying layers 16a and 16b having refraction indexes different from each other, which causes a difference between Bragg wavelengths of two DFB sections to improve the modulation index. Furthermore, two modes oscillate at the portion where stop bands of two DFB sections are overlapped with each other.

FIG. 4 shows the relationship between optical intensity and time. It can be known that modulation index ([peak value−average value]/average value) of the generated pulse is stabilized to be close to 1 from FIG. 4. In the case that there is no portion where two stop bands are overlapped with each other, more than four modes oscillate to remarkably decrease the modulation index.

Furthermore, a pulse repetition rate of more than tens of GHz can be obtained by varying a current applied to the Fabry-Perot region. This means improvement of practical utilization.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

As described above, the multi DFB laser diode according to the present invention has layers having different refractive indexes which are included in two DFB sections so that the modulation index and process yield of the multi DFB laser diode can be easily improved.

What is claimed is:

1. A multi DFB laser diode for generating a spontaneous pulse, comprising:
   first and second DFB sections each of which has a substrate including a diffraction grating, an active layer formed on the substrate, a clad layer that is formed on the active layer and includes a refraction varying layer, and an electrode formed on the active layer; and
   a phase tuning section that includes a substrate, an active layer formed on the substrate, a clad layer formed on the active layer, and an electrode, the electrode being isolated from the electrode of the first and second DFB sections.

2. The multi DFB laser diode as claimed in claim 1, wherein the refraction varying layer included in the active layer of the first DFB section has a refractive index different from that of the refraction varying layer included in the active layer of the second DFB section.

3. The multi DFB laser diode as claimed in claim 1, wherein the first and second DFB sections and the phase tuning section are formed on one substrate, and the electrodes of the first and second DFB sections and the phase tuning section are isolated from each other by an etched groove.

4. The multi DFB laser diode as claimed in claim 1, wherein the outer sides of the first and second DFB sections are shielded by an anti-reflecting thin film.

5. The multi DFB laser diode as claimed in claim 1, wherein the substrate is formed of n-InP, the active layer is formed of InGaAsP, and the clad layer is formed of P-InP.

6. The multi DFB laser diode as claimed in claim 5, wherein p-InP and n-InP are sequentially deposited on both sides of the active layer in a manner such that the p-InP and n-InP etch both sides of the diffraction grating included in the substrate, to form a p-n-p blocking structure between the clad layer formed on the n-InP layer and the substrate.

7. The multi DFB laser diode as claimed in claim 1, further comprising a SiNx layer formed between the first and second DFB sections and the clad layer.

8. A method for fabricating a multi DFB laser diode for generating a spontaneous pulse, the method comprising the steps of:
   forming a substrate;
   forming a diffraction grating in the substrate;
   forming an active layer on the substrate;
   forming refraction varying layers in the active layer;
   forming an electrode on the active layer; and
   forming two etched grooves to divide the electrode into three parts which are isolated from one another,
   wherein the diffraction grating and the refraction varying layer are formed in the regions corresponding to two parts among the divided three electrode parts, which are respectively located at both sides.

9. The method for fabricating a multi DFB laser diode as claimed in claim 8, wherein the refraction varying layers respectively formed at the regions corresponding to the electrode parts located at both sides have refractive indexes different from each other.

* * * * *